United States Patent
Kim

(10) Patent No.: US 11,688,454 B2
(45) Date of Patent: Jun. 27, 2023

(54) SEMICONDUCTOR MEMORY DEVICE AND MEMORY SYSTEM INCLUDING THE SAME

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 17/505,234

(22) Filed: Oct. 19, 2021

(65) Prior Publication Data
US 2022/0189537 A1    Jun. 16, 2022

Related U.S. Application Data

(60) Provisional application No. 63/123,685, filed on Dec. 10, 2020.

(30) Foreign Application Priority Data

Jan. 29, 2021  (KR) .................. 10-2021-0013436

(51) Int. Cl.
*G06F 3/06* (2006.01)
*G11C 11/40* (2006.01)
(Continued)

(52) U.S. Cl.
CPC ...... *G11C 11/40618* (2013.01); *G06F 3/0604* (2013.01); *G06F 3/0644* (2013.01); *G06F 3/0679* (2013.01); *G11C 11/4085* (2013.01)

(58) Field of Classification Search
CPC .......... G11C 11/40618; G11C 11/4085; G11C 11/408; G11C 11/406; G11C 11/4063;
(Continued)

(56) References Cited

U.S. PATENT DOCUMENTS 7,379,323 B2 * 5/2008 Miyamoto .............. G11C 11/22
                                                    365/230.03
10,504,577 B1 * 12/2019 Alzheimer .......... G11C 11/4094
(Continued)

FOREIGN PATENT DOCUMENTS

KR      1020140012503 A      2/2014

OTHER PUBLICATIONS

E. Lee, I. Kang, S. Lee, G. E. Suh and J. H. Ahn, "TWiCe: Preventing Row-hammering by Exploiting Time Window Counters," 2019 ACM/IEEE 46th Annual International Symposium on Computer Architecture (ISCA), Phoenix, AZ, USA, 2019, pp. 385-396. (Year: 2019).*

(Continued)

*Primary Examiner* — Khoa D Doan
(74) *Attorney, Agent, or Firm* — IP & T Group LLP

(57) ABSTRACT

A memory system includes: a memory device including at least one bank; and a memory controller suitable for: dividing the bank into a plurality of sub-regions according to an active address, generating an aging signal for the bank based on a plurality of counting values generated by counting a number of inputs of an active command for each of the sub-regions, and providing the active command, the active address, the aging signal, and a target refresh command, wherein the memory device is suitable for: generating a sampling address by sampling the active address according to the active command, and performing a target refresh operation on a word line corresponding to the sampling address according to the target refresh command while adjusting a refresh period of the bank according to the aging signal.

24 Claims, 14 Drawing Sheets

(51) Int. Cl.
  *G11C 11/406* (2006.01)
  *G11C 11/408* (2006.01)
(58) Field of Classification Search
  CPC .... G06F 3/0604; G06F 3/0644; G06F 3/0679; G06F 3/0653; G06F 3/0619; G06F 3/0659; G06F 3/0688
  See application file for complete search history.

(56) References Cited

U.S. PATENT DOCUMENTS

2020/0381040 A1\* 12/2020 Penney ................. G11C 11/408
2021/0005240 A1\* 1/2021 Brown .................. G11C 11/406

OTHER PUBLICATIONS

S. Wang, M. N. Bojnordi, X. Guo and E. Ipek, "Content Aware Refresh: Exploiting the Asymmetry of DRAM Retention Errors to Reduce the Refresh Frequency of Less Vulnerable Data," in IEEE Transactions on Computers, vol. 68, No. 3, pp. 362-374, Mar. 1, 2019, doi: 10.1109/TC.2018.2868338. (Year: 2019).\*

\* cited by examiner

SEMICONDUCTOR MEMORY DEVICE AND MEMORY SYSTEM INCLUDING THE SAME

CROSS-REFERENCE TO RELATED APPLICATIONS

The present application claims the benefit of U.S. Provisional Patent Application No. 63/123,685, filed on Dec. 10, 2020 and Korean Patent Application No. 10-2021-0013436, filed on Jan. 29, 2021, which are both incorporated herein by reference in their entirety.

BACKGROUND

1. Field

Various embodiments of the present invention relate to a semiconductor design technology, and more particularly, to a memory system including a semiconductor memory device that performs a target refresh operation.

2. Description of the Related Art

A memory cell of a semiconductor memory device includes a transistor that functions as a switch and a capacitor that stores charges (or data). Data is determined to be at a logic high level (logic level 1) and at a logic low level (logic level 0) according to whether there is any charge in the capacitor of a memory cell, that is, whether the terminal voltage of the capacitor is high or low.

Data are stored in a form in which charges are accumulated in a capacitor, and theoretically, there is no power consumption. However, since there may be a leakage current due to such reasons such as a PN coupling of a transistor, the initial amount of charges stored in the capacitor may disappear, which leads to the loss of data. To prevent this from occurring, the data in a memory cell is read before the data gets lost, and a normal amount of charges according to the read data should be recharged back into the memory cell. The data may be retained only when such an operation is repeated periodically, and the process of recharging cell charges is referred to as a refresh operation which will be, hereinafter, referred to as a normal refresh operation.

Recently, in addition to the normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. In order to prevent the row hammering phenomenon, a target refresh operation is performed on a word line that is activated more than a predetermined number of times which is, hereinafter, referred to as a 'target word line', and the word lines disposed adjacent to the word line.

In order to select a word line to be refreshed during the target refresh operation, the memory device needs to count all of the addresses inputted with an active command. The memory device has counting circuits to count the number of inputs of the addresses, and as technological scaling progresses, the smaller the size of the memory device, the larger the portion the counting circuits occupy.

SUMMARY

Embodiments of the present invention are directed to a memory system including a memory controller capable of providing information that analyzes patterns with high risk of row hammer per bank, and a memory device capable of adjusting a target refresh period per bank based on the analyzed information.

According to an embodiment of the present invention, a memory system includes a memory device including at least one bank; and a memory controller suitable for: dividing the bank into a plurality of sub-regions according to an active address, generating an aging signal for the bank based on a plurality of counting values generated by counting a number of inputs of an active command for each of the sub-regions, and providing the active command, the active address, the aging signal, and a target refresh command, wherein the memory device is suitable for: generating a sampling address by sampling the active address according to the active command, and performing a target refresh operation on a word line corresponding to the sampling address according to the target refresh command while adjusting a refresh period of the bank according to the aging signal.

According to an embodiment of the present invention, a memory system includes a memory device including at least one bank; and a memory controller suitable for: dividing the bank into a plurality of sub-regions according to an active address, generating an aging signal for the bank based on a plurality of counting values generated by counting a number of inputs of an active command for each of the sub-regions, generating a row hammer address according to the aging signal, and providing the aging signal, and a target refresh command with the row hammer address, wherein the memory device is suitable for performing a target refresh operation on a word line corresponding to the row hammer address according to the target refresh command while adjusting a refresh period of the bank according to the aging signal.

According to an embodiment of the present invention, a memory controller includes a processor suitable for generating an active command and an active address corresponding to a request from a host; a sub-counting circuit suitable for: dividing at least one bank of a memory device into a plurality of sub-regions according to the active address, and generating a plurality of counting values by counting a number of inputs of the active command for each of the sub-regions based on the active address; an aging decision circuit suitable for generating an aging signal for the bank and a count reset signal by calculating an average of the counting values and calculating a standard deviation based on the average, wherein the count reset signal initializes the sub-counting circuit; and a tracking circuit suitable for: generating a target refresh command based on the active command, and generating a row hammer address corresponding to the active address according to the aging signal and the counting values when the number of inputs of the active command for the bank is greater than a preset number.

According to an embodiment of the present invention, a memory system includes a memory device including a group of plural memory regions; and a memory controller configured to generate a shortening signal when activation counts of the memory regions are statistically concentrated by a set amount or greater, wherein the memory device is configured to perform a target refresh operation on the group at a shortened period in response to the shortening signal, and wherein the activation count of each of the memory regions is a number of active commands provided for the memory region for a set amount of time.

Further, according to embodiments of the present invention, the memory system may achieve the row hammer mitigation with a minimum area in a way that the memory controller divides each bank into a plurality of sub-regions to analyze the number of activations per sub-region, and the memory device adjusts the target refresh period for each bank according to the information analyzed by the memory controller.

DETAILED DESCRIPTION

Figure 1A:
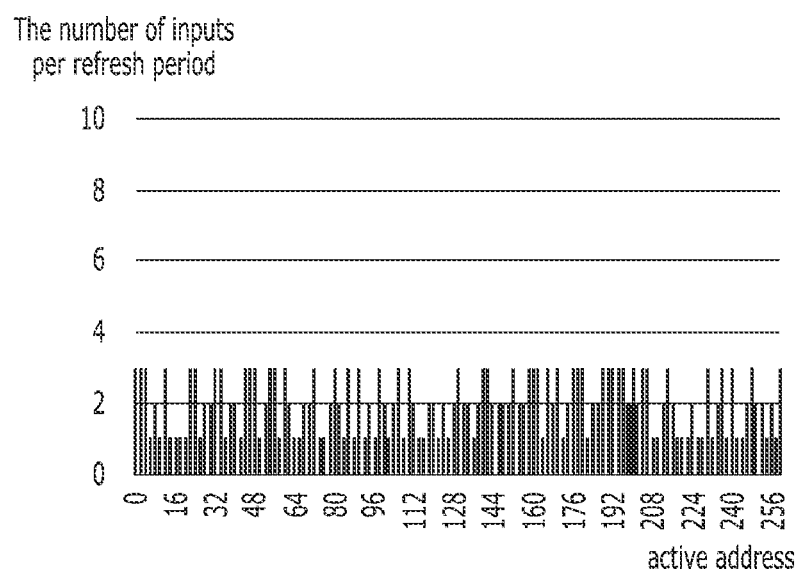
FIGS. 1A and 1B are graphs illustrating the number of inputs for an active address per refresh cycle in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, to focus on a refresh operation, a description of a configuration associated with a data input/output operation will be omitted. In particular, for ease of description, an address used by a memory controller in a memory system may be assigned by a reference numeral "_ADD", and an address used in a memory device may be assigned by a reference numeral "ADD_".

Figure 1B:
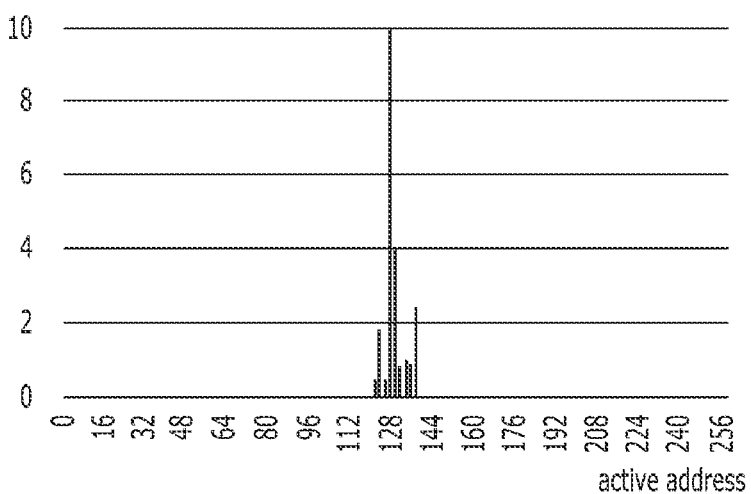

FIGS. 1A and 1B are graphs illustrating the number of inputs for an active address per refresh cycle in accordance with an embodiment of the present invention.

Referring to FIG. 1A, it is illustrated that addresses (hereinafter defined as "active addresses") that are entered with an active command during one refresh cycle are evenly distributed. That is, FIG. 1A shows a case where the row hammer risk is lower since the number of activations per address is evenly distributed. In this case, since the number of activations per address within one refresh cycle (hereinafter defined as "active aggressor") is small, a memory device may respond to the row hammer risk through a target refresh operation performed therein.

Referring to FIG. 1B, it is illustrated that the active addresses during one refresh cycle are concentrated only on some particular addresses. That is, FIG. 1B shows a case where the active aggressor per address is abnormally increased due to a special occurrence such as hacking, resulting in the high row hammer risk. In this case, since the target refresh operation performed within the memory device alone makes it difficult to respond to the row hammer risk, additional help from a memory controller is needed.

Disclosed hereinafter is a scheme of achieving the row hammer mitigation of the memory system. In accordance with an embodiment of the present invention, the memory controller may analyze a case where the row hammer risk is high, that is, the active aggressor is concentrated only on some particular address types, as shown in FIG. 1B. Then, the memory device may adjust a target refresh period (or cycle) for each bank according to the information analyzed by the memory controller.

Figure 2:
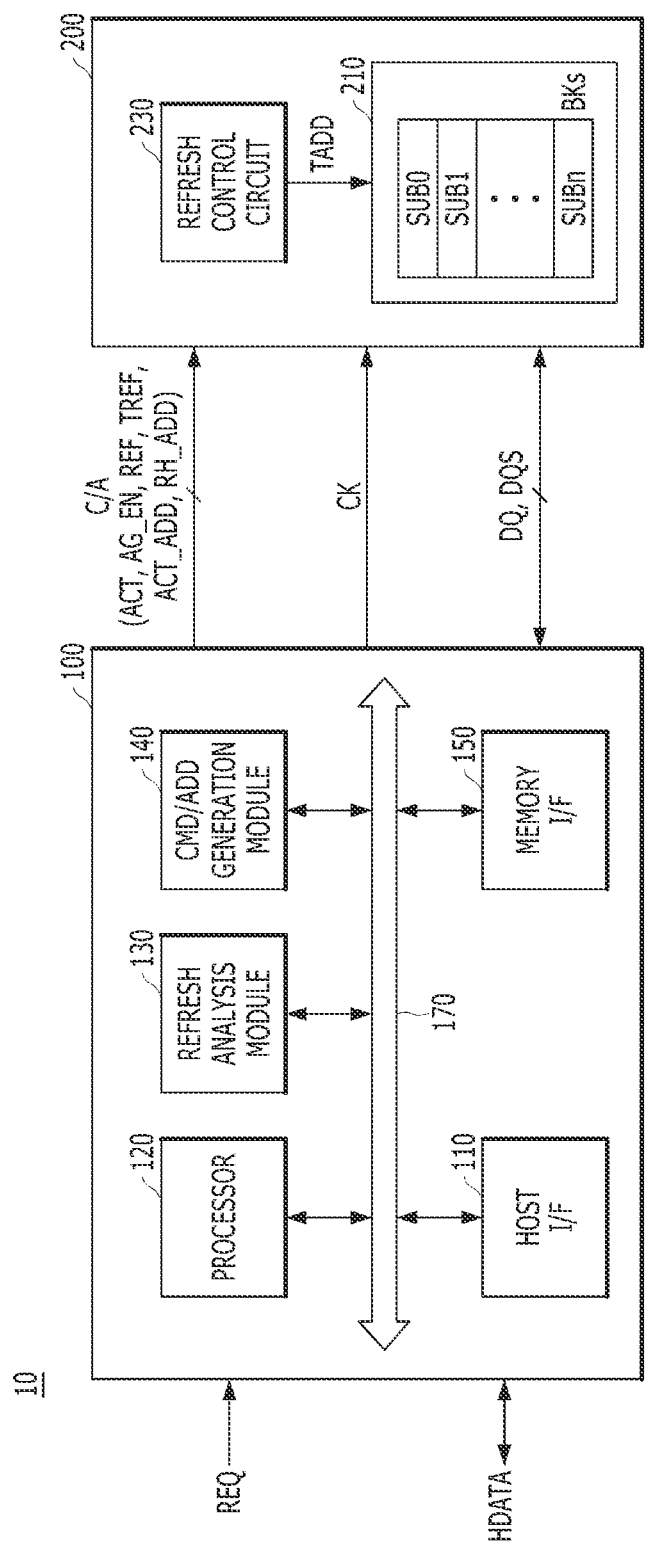
FIG. 2 is a block diagram illustrating a memory system in accordance with an embodiment of the present invention.

FIG. 2 is a block diagram illustrating a memory system 10 in accordance with an embodiment of the present invention.

Referring to FIG. 2, the memory system 10 may include a memory controller 100, and a semiconductor memory device 200.

The memory controller 100 may control the general operation of the memory system 10 and it may control general data exchange between a host and the semiconductor memory device 200. The memory controller 100 may generate a command/address signal C/A according to a request REQ from the host, and provide the generated command/address signal C/A to the semiconductor memory device 200. The memory controller 100 may provide a clock CK together with the command/address signal C/A to the semiconductor memory device 200. The memory controller 100 may provide data DQ corresponding to host data HDATA provided from the host to the semiconductor memory device 200 together with a data strobe signal DQS. The memory controller 100 may receive the data DQ read from the semiconductor memory device 200 together with the data strobe signal DQS, and provide the data DQ and the data strobe signal DQS to the host as the host data HDATA.

In detail, the memory controller 100 may include a host interface (host I/F) 110, a processor 120, a refresh analysis module 130, a command/address (CMD/ADD) generation module 140, a memory interface (memory I/F) 150, and a bus 170.

The host interface 110 may be configured to communicate with the host connected to the memory system 10 under the control of the processor 120. For example, the host interface 110 may receive the request REQ and the host data HDATA from the host, and provide the host data HDATA to the host by receiving the data DQ read from the semiconductor memory device 200 through the memory interface 150.

The processor 120 may perform various types of computational and/or other operations for controlling the semiconductor memory device 200, and/or may execute instructions in the form of firmware or other types of software. The processor 120 may receive the request REQ and the host data HDATA provided from the host through the host interface 110. The processor 120 may generate various commands corresponding to the request REQ, such as an active command ACT, a read command, a write command, and an address, to provide the commands to the refresh analysis module 130 and the command/address generation module 140. The processor 120 may transmit the host data HDATA to the memory interface 150. The address generated with the active command ACT may be defined as an active address ACT_ADD. The processor 120 may control overall operations of the host interface 110, the refresh analysis module 130, the command/address generation module 140, and the memory interface 150.

The refresh analysis module 130 may generate commands relating to a refresh operation, such as a normal refresh command REF and a target refresh command TREF, based on the active command ACT provided from the processor 120. The refresh analysis module 130 may generate the target refresh command TREF after generating a set number of the normal refresh commands REF at regular intervals whenever the number of inputs of the active command ACT reaches a certain number. In accordance with a first embodiment of the present invention, the refresh analysis module 130 may divide at least one bank BK of the semiconductor memory device 200, into a plurality of sub-regions SUB0 to SUBn, and generate an aging signal AG_EN for the bank based on counting values generated by counting the number of inputs of the active command ACT per sub-region within the bank. A detailed configuration of the refresh analysis module 130 in accordance with the first embodiment will be described in FIGS. 3 to 5B. In accordance with a second embodiment of the present invention, the refresh analysis module 130 may additionally generate a row hammer address RH_ADD corresponding to the active address ACT_ADD according to the aging signal AG_EN when the number of inputs of the active command ACT for each bank BK is greater than a set number. A detailed configuration of the refresh analysis module 130 in accordance with the second embodiment will be described in FIGS. 11 to 13.

The command/address generation module 140 may generate the command/address signal C/A by scheduling the commands and address provided from the processor 120 and the refresh analysis module 130. The command/address generation module 140 may provide the active address ACT_ADD together with the active command ACT, as the command/address signal C/A, and provide the normal refresh command REF, the target refresh command TREF or the aging signal AG_EN as the command/address signal C/A. The command/address generation module 140 may provide a bank address including information on the banks BKs of the semiconductor memory device 200, together with the normal refresh command REF, the target refresh command TREF or the aging signal AG_EN, as the command/address signal C/A.

The memory interface 150 may be configured to communicate with the semiconductor memory device 200 under the control of the processor 120. For example, the memory interface 150 may transmit the command/address signal C/A and the data DQ to the semiconductor memory device 200, and transmit the data DQ read from the semiconductor memory device 200 to the host interface 110.

The processor 120 may transmit data between the host interface 110, the refresh analysis module 130, the command/address generation module 140, and the memory interface 150 via the bus 170. According to an embodiment, the host interface 110, the refresh analysis module 130, the command/address generation module 140, and the memory interface 150 may communicate with each other independently without passing through the bus 170. For example, the refresh analysis module 130 and host interface 110 may communicate directly with each other without passing through the bus 170. The refresh analysis module 130 and the memory interface 150 may communicate with each other directly without passing through the bus 170. The host interface 110 and the memory interface 150 may also communicate directly with each other without passing through the bus 170.

The semiconductor memory device 200 may perform a refresh operation, a write operation, and a read operation according to the clock CK, the command/address signal C/A, the data strobe signal DQS, and/or the data DQ that are provided from the memory controller 100. The refresh operation may include a normal refresh operation in which the semiconductor memory device 200 sequentially refreshes a plurality of word lines during a normal refresh period, and a target refresh operation in which one or more neighboring word lines disposed adjacent to a word line having a large number of activations or a high frequency of activations are refreshed, during a target refresh period.

The semiconductor memory device 200 may generate an internal command (ICMD of FIG. 6) and an internal address (IADD of FIG. 6) by buffering the command/address signal C/A, and may generate an active command ACT, a precharge command PCG, a normal refresh command REF, a target refresh command TREF, and an aging signal AG_EN, which are related to a row control operation, by decoding the command ICMD. The semiconductor memory device 200 may perform the normal refresh operation according to the normal refresh command REF and perform the target refresh operation according to the target refresh command TREF while adjusting a refresh period according to the aging signal AG_EN. For reference, the internal address IADD may correspond to the active address ACT_ADD when the active command ACT is generated. Depending on an embodiment, the internal address IADD may correspond to the row hammer address RH_ADD when the target refresh command TREF is generated. Further, the semiconductor memory device 200 may additionally generate commands related to data input/output operations (e.g., a read command or a write command) by decoding the internal command ICMD.

In detail, the semiconductor memory device 200 may include a memory cell array 210 and a refresh control circuit 230.

The memory cell array 210 may include a plurality of banks BKs. In each of the banks BKs, a plurality of memory cells (not shown) coupled to a plurality of word lines (not shown) and a plurality of bit lines (not shown) may be arranged in the form of an array. Each of the banks BKs may be divided into the sub-regions SUB0 to SUBn. The sub-regions SUB0 to SUBn may be configured to have different word lines. For example, when 4096 word lines are disposed in each bank, first to eighth sub-regions SUB0 to SUB7 may be sequentially separated to include 512 word lines.

The refresh control circuit 230 may provide a target address TADD to select a word line to be refreshed during the target refresh operation, among the word lines. In accordance with the first embodiment, the refresh control circuit 230 may sample the active address ACT_ADD according to the active command ACT to generate a sampling address per bank and perform the target refresh operation on a word line corresponding to the sampling address according to the target refresh command TREF while adjusting a refresh period per bank according to the aging signal AG_EN. A detailed configuration of the refresh control circuit 230 in accordance with the first embodiment will be described in FIGS. 6 to 9. In accordance with the second embodiment, the refresh control circuit 230 may perform the target refresh operation on a word line corresponding to the row hammer address RH_ADD provided from the memory controller 100, according to the target refresh command TREF, while adjusting a refresh period per bank according to the aging signal AG_EN. A detailed configuration of the refresh control circuit 230 in accordance with the second embodiment will be described in FIG. 14.

As described above, in accordance with an embodiment of the present invention, the memory controller 100 may divide each bank BK into the plurality of sub-regions SUB0 to SUBn to analyze the number of activations per sub-region within the bank, and the semiconductor memory device 200 may adjust the target refresh period for each bank BK according to the information analyzed by the memory controller 100. Accordingly, the memory system 10 may achieve the row hammer mitigation with a minimum area.

Hereinafter, a detailed configuration of the memory system 10 in accordance with the first embodiment will be described. In the following embodiments, it is described that the semiconductor memory device 200 has first to (k+1)th banks BK0 to BKk and each bank has first to (n+1)th sub-regions SUB0 to SUBn, as an example.

Figure 3:
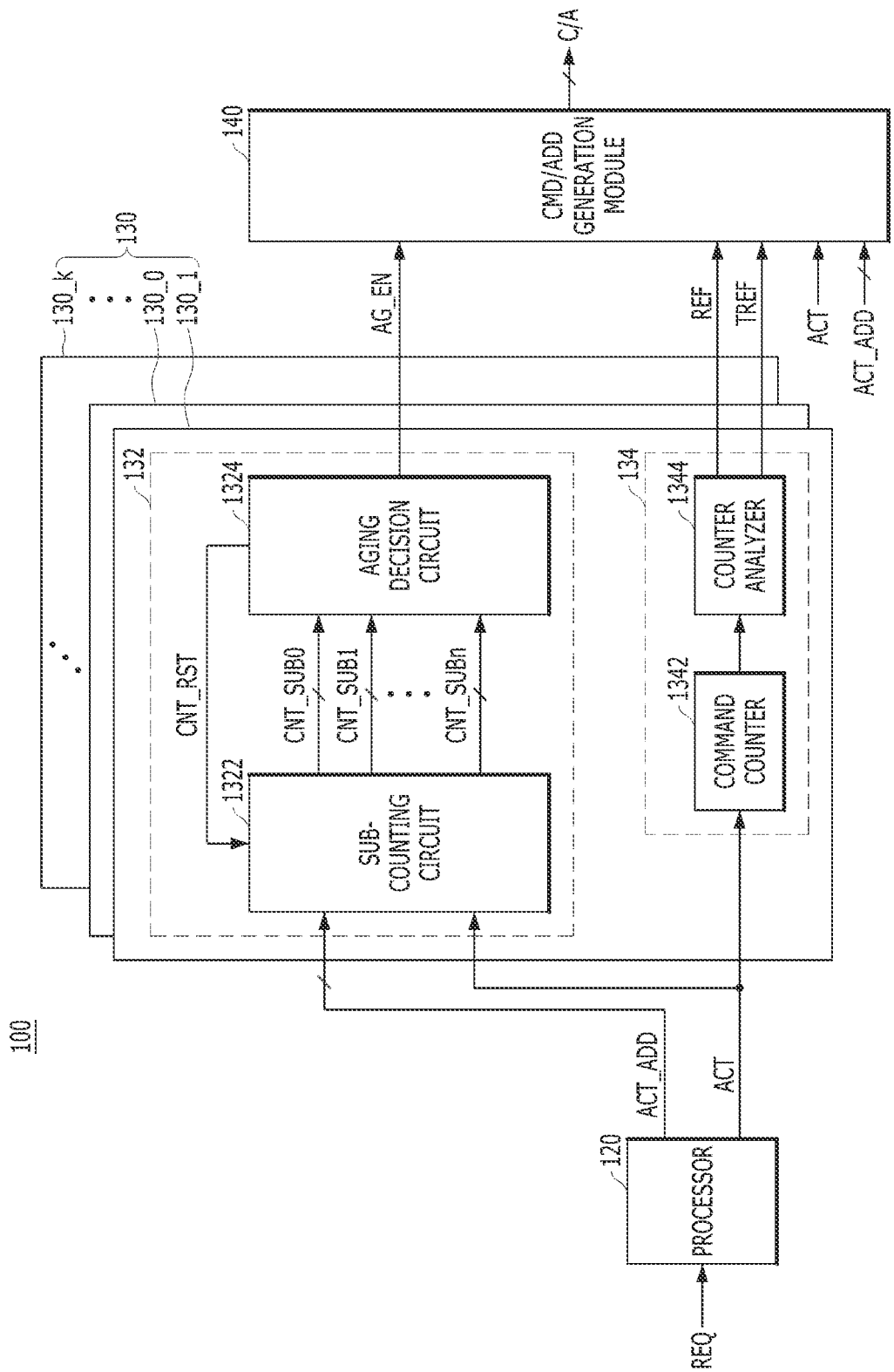
FIG. 3 is a detailed block diagram illustrating a memory controller shown in FIG. 1, in accordance with a first embodiment of the present invention.

FIG. 3 is a detailed block diagram illustrating the memory controller 100 shown in FIG. 1, in accordance with the first embodiment of the present invention. In FIG. 3, to focus on the characteristics of the embodiment, additional configurations (e.g., the host interface 110 and the memory interface 150) have been omitted.

Referring to FIG. 3, the processor 120 may receive the request REQ from the host through the host interface 110. The processor 120 may generate the active command ACT and the active address ACT_ADD corresponding to the request REQ.

The refresh analysis module 130 may include a plurality of analysis circuits 130_0 to 130_k respectively corresponding to the banks BK0 to BKk of the semiconductor memory device 200. Each of the analysis circuits 130_0 to 130_k may include an aging analysis circuit 132 and a refresh command issue circuit 134.

The aging analysis circuit 132 may generate a plurality of counting values CNT_SUB0 to CNT_SUBn by counting the number of inputs of the active command ACT per sub-region of a corresponding bank among the banks BK0 to BKk, based on the active address ACT_ADD. The number of inputs of the active command ACT per sub-region may be counted for a set amount of time. The number of inputs of the active command ACT per sub-region may be counted periodically. At each amount of time, the number of inputs of the active command ACT per sub-region may be initialized when a count reset signal CNT_RST is generated, which will be described later. The aging analysis circuit 132 may calculate a standard deviation of the counting values CNT_SUB0 to CNT_SUBn, and generate the aging signal AG_EN for the corresponding bank according to the standard deviation.

In detail, the aging analysis circuit 132 may include a sub-counting circuit 1322 and an aging decision circuit 1324.

The sub-counting circuit 1322 may generate the counting values CNT_SUB0 to CNT_SUBn by counting the number of inputs of the active command ACT per sub-region of the corresponding bank, based on the active address ACT_ADD. The sub-counting circuit 1322 may be initialized by a count reset signal CNT_RST.

The aging decision circuit 1324 may generate the aging signal AG_EN and the count reset signal CNT_RST of the corresponding bank by calculating an average of the counting values CNT_SUB0 to CNT_SUBn and calculating the standard deviation based on the average. When the standard deviation is greater than a reference value, the aging decision circuit 1324 may disable the aging signal AG_EN but enable the count reset signal CNT_RST. When the standard deviation is less than or equal to the reference value, the aging decision circuit 1324 may enable the aging signal AG_EN but disable the count reset signal CNT_RST The refresh command issue circuit 134 may generate the normal refresh command REF and the target refresh command TREF, based on the active command ACT provided from the processor 120. The refresh command issue circuit 134 may issue the target refresh command TREF or the normal refresh command REF when the number of inputs of the active command ACT reaches a certain number.

For example, the refresh command issue circuit 134 may include a command counter 1342 and a counter analyzer 1344.

The command counter 1342 may generate a count value by counting the number of inputs of the active command ACT. The counter analyzer 1344 may issue a set number of the normal refresh commands REF at regular intervals whenever the count value reaches the certain number. The counter analyzer 1344 may issue the target refresh command TREF after issuing the set number of the normal refresh commands REF. For example, the counter analyzer 1344 may issue at least one target refresh command TREF after issuing 4096 normal refresh commands REF whenever the count value reaches 10.

The command/address generation module 140 may generate the command/address signal C/A by scheduling the active command ACT and the active address ACT_ADD provided from the processor 120, and the normal refresh commands REF, the target refresh command TREF and the aging signal AG_EN provided from the refresh analysis module 130. The command/address generation module 140 may output the active address ACT_ADD together with the active command ACT, as the command/address signal C/A, and provide the normal refresh command REF, the target refresh command TREF or the aging signal AG_EN together with the bank address including the bank information, as the command/address signal C/A.

Figure 4:
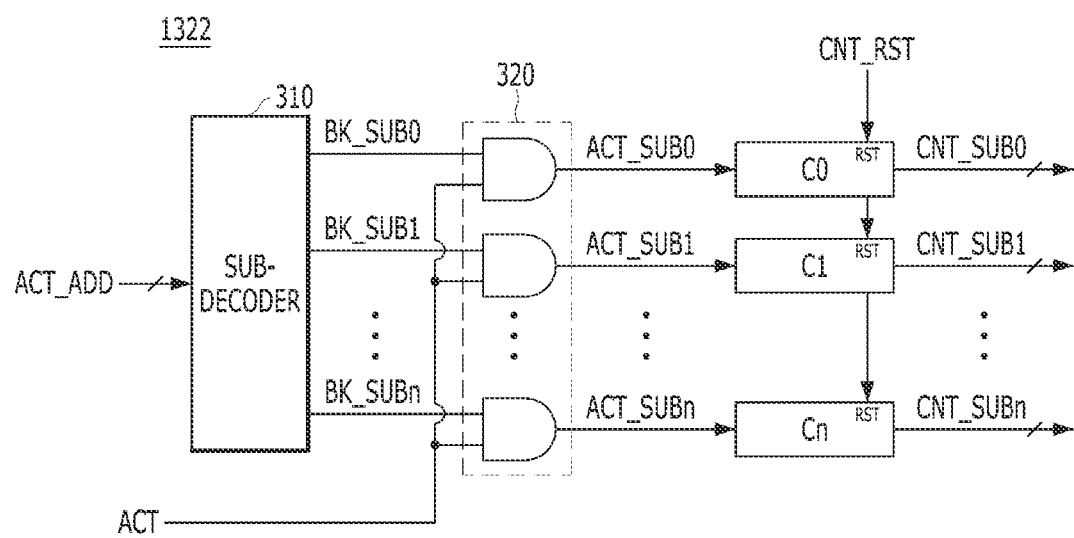
FIG. 4 is a detailed configuration diagram illustrating a sub-counting circuit of FIG. 3 in accordance with an embodiment of the present invention.

FIG. 4 is a detailed configuration diagram illustrating the sub-counting circuit 1322 of FIG. 3 in accordance with an embodiment of the present invention.

Referring to FIG. 4, the sub-counting circuit 1322 may include a sub-decoder 310, an active combiner 320, and a plurality of sub-counters C0 to Cn.

The sub-decoder 310 may decode the active address ACT_ADD to generate a plurality of sub-region signals BK_SUB0 to BK_SUBn for respectively designating the sub-regions SUB0 to SUBn of the corresponding bank. In an embodiment, the sub-decoder 310 may generate the sub-region signals BK_SUB0 to BK_SUBn by decoding some of bits in the active address ACT_ADD, which specify the word lines. When the active address ACT_ADD<0:x> is composed of (x+1) bits, the sub-decoder 310 may decode (m+1) bits (e.g., ACT_ADD<0:m>) in the active address ACT_ADD<0:x>, wherein (m+1) bits ACT_ADD<0:m> correspond to a row address for designating the word lines. For example, the sub-decoder 310 may enable the first sub-region signal BK_SUB0 when the active address ACT_ADD<0:x> for designating a second word line included in the first sub-region SUB0 is inputted.

The active combiner 320 may respectively output the sub-region signals BK_SUB0 to BK_SUBn as a plurality of sub-region activation signals ACT_SUB0 to ACT_SUBn, when the active command ACT is inputted. For example, the active combiner 320 may be implemented with a plurality of AND gates for performing a logic AND operation on the active command ACT and the sub-region activation signals ACT_SUB0 to ACT_SUBn, respectively.

The sub-counters C0 to Cn may respectively correspond to the sub-regions SUB0 to SUBn. Each of the sub-counters C0 to Cn may generate a corresponding counting value of the counting values CNT_SUB0 to CNT_SUBn by increasing its counting value by +1 when a corresponding sub-region activation signal of the sub-region activation signals ACT_SUB0 to ACT_SUBn is enabled. The sub-counters C0 to Cn may be initialized when the count reset signal CNT_RST is enabled.

With the above configuration, the sub-counting circuit 1322 may generate the counting values CNT_SUB0 to CNT_SUBn by counting the number of inputs of the active command ACT per sub-region of the corresponding bank, based on the active address ACT_ADD.

Figure 5A:
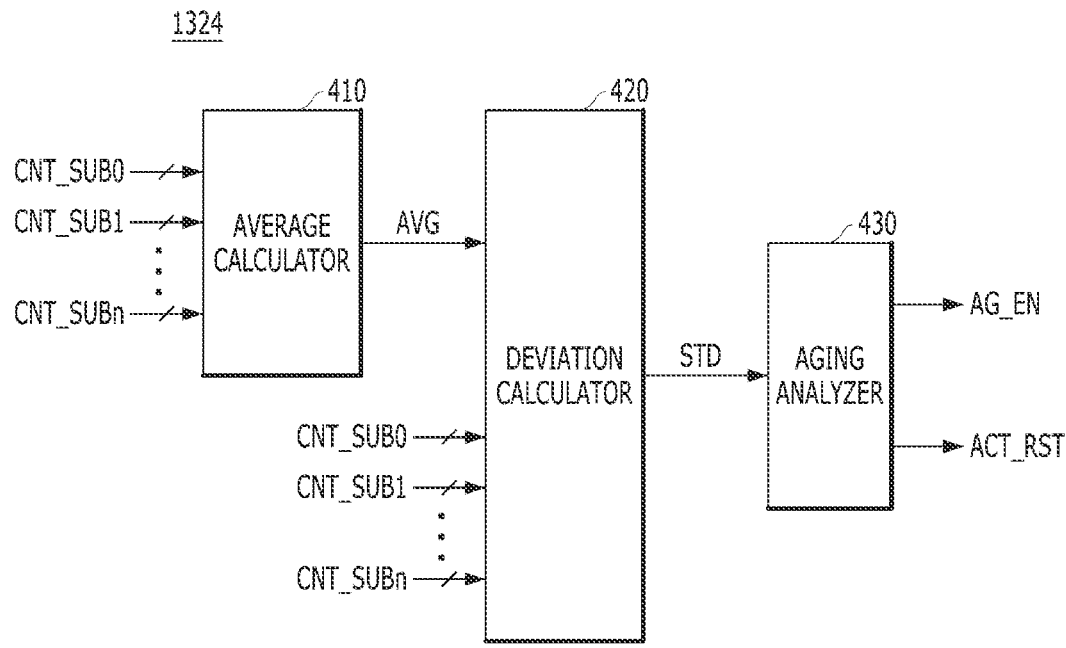
FIG. 5A is a detailed configuration diagram illustrating an aging decision circuit of FIG. 3 in accordance with an embodiment of the present invention.
Figure 5B:
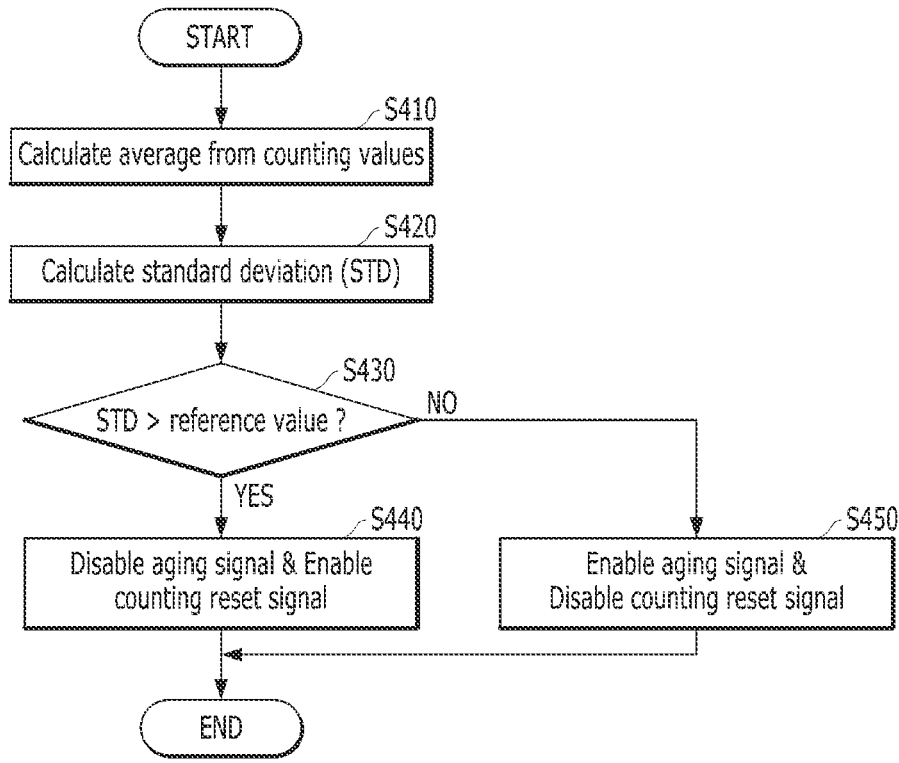
FIG. 5B is a flow chart illustrating an operation of the aging decision circuit of FIG. 3 in accordance with an embodiment of the present invention.

FIG. 5A is a detailed configuration diagram and FIG. 5B is a flow chart illustrating the aging decision circuit 1324 of FIG. 3.

Referring to FIG. 5A, the aging decision circuit 1324 may include an average calculator 410, a deviation calculator 420, and an aging analyzer 430.

The average calculator 410 may calculate an average AVG of the counting values CNT_SUB0 to CNT_SUBn. For example, the average calculator 410 may output the average AVG by dividing the sum of the counting values CNT_SUB0 to CNT_SUBn, by n+1.

The deviation calculator 420 may calculate a standard deviation STD based on the average AVG. For example, the deviation calculator 420 may calculate a variance by dividing the sum of the squares of the deviation between the average AVG and the counting values CNT_SUB0 to CNT_SUBn, by n+1, and output the square root of the variance as the standard deviation STD.

For reference, the standard deviation STD may be a parameter indicating how much the counting values CNT_SUB0 to CNT_SUBn deviate from the average AVG. A smaller standard deviation STD may mean that the counting values CNT_SUB0 to CNT_SUBn are concentrated near the average AVG. A larger standard deviation STD may mean that the counting values CNT_SUB0 to CNT_SUBn deviate more from the average AVG.

The aging analyzer 430 may generate the aging signal AG_EN and the count reset signal CNT_RST based on the standard deviation STD. When the standard deviation STD is greater than the reference value, the aging analyzer 430 may determine that the row hammer risk is lower since the number of activations per address is evenly distributed as shown in FIG. 1A, thereby disabling the aging signal AG_EN but enabling the count reset signal CNT_RST. When the standard deviation STD is less than or equal to the reference value, the aging analyzer 430 may determine that the row hammer risk is higher since the active aggressor per address is abnormally increased as shown in FIG. 1B, thereby enabling the aging signal AG_EN but disabling the count reset signal CNT_RST.

Referring to FIG. 5B, the average calculator 410 may calculate the average AVG from the counting values CNT_SUB0 to CNT_SUBn (at S410). The deviation calculator 420 may calculate the standard deviation STD based on the average AVG (at S420). When the standard deviation STD is greater than the reference value ("YES" of S430), the aging analyzer 430 may disable the aging signal AG_EN but enable the count reset signal CNT_RST (at S440). On the contrary, when the standard deviation STD is less than or equal to the reference value, the aging analyzer 430 may enable the aging signal AG_EN but disable the count reset signal CNT_RST (at S450).

Figure 6:
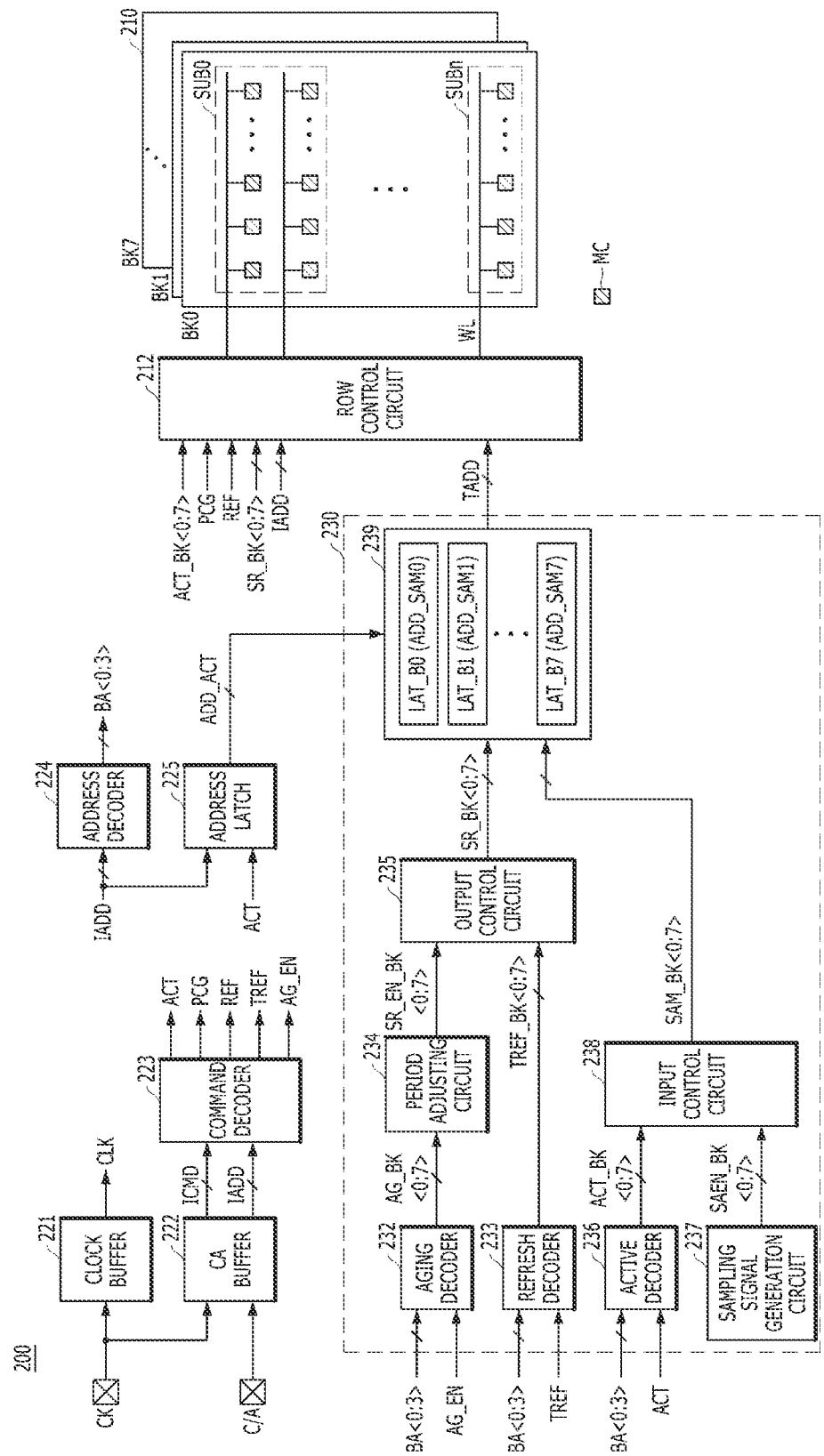
FIG. 6 is a detailed block diagram illustrating a memory device corresponding to the memory controller shown in FIG. 3, in accordance with an embodiment of the present invention.
Figure 7:
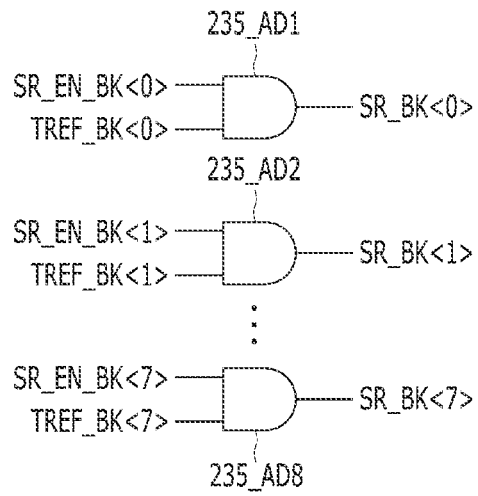
FIG. 7 is a detailed circuit diagram illustrating an output control circuit of FIG. 6 in accordance with an embodiment of the present invention.
Figure 8:
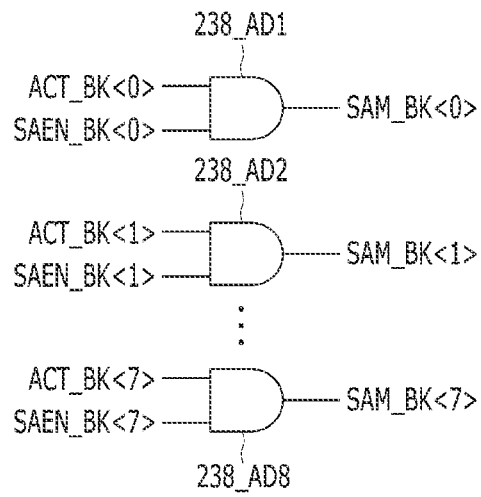
FIG. 8 is a detailed circuit diagram illustrating an input control circuit of FIG. 6 in accordance with an embodiment of the present invention.
Figure 9:
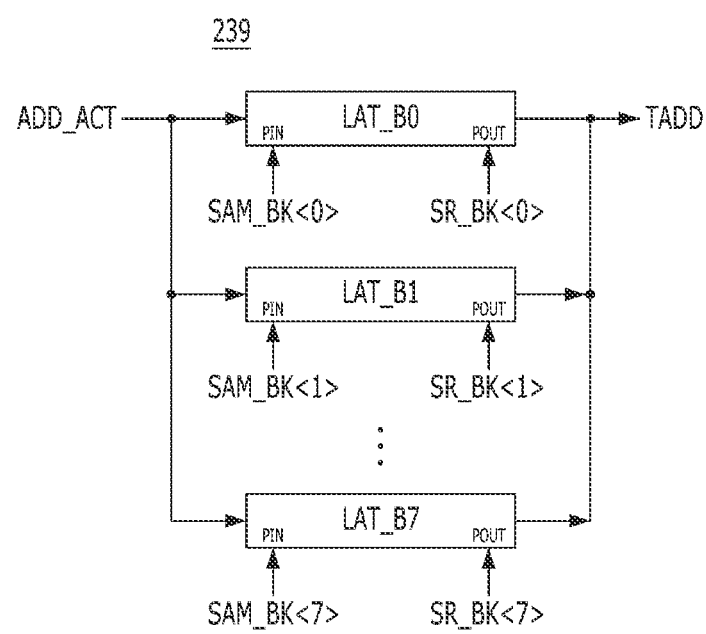
FIG. 9 is a detailed configuration diagram illustrating an address storing circuit of FIG. 6 in accordance with an embodiment of the present invention.

FIG. 6 is a detailed block diagram illustrating the semiconductor memory device 200 corresponding to the memory controller 100 shown in FIG. 3, in accordance with an embodiment of the present invention. FIG. 7 is a detailed circuit diagram illustrating an output control circuit 235 of FIG. 6 in accordance with an embodiment of the present invention. FIG. 8 is a detailed circuit diagram illustrating an input control circuit 238 of FIG. 6 in accordance with an embodiment of the present invention. FIG. 9 is a detailed configuration diagram illustrating an address storing circuit 239 of FIG. 6 in accordance with an embodiment of the present invention. FIG. 6 shows that the semiconductor memory device 200 includes first to eighth banks BK0 to BK7 in the memory cell array 210.

Referring to FIG. 6, the semiconductor memory device 200 may include the memory cell array 210, a row control circuit 212, a clock buffer 221, a command/address (CA) buffer 222, a command decoder 223, an address decoder 224, an address latch 225, and the refresh control circuit 230.

The memory cell array 210 may include the first to eighth banks BK0 to BK7. In each of the first to eighth banks BK0 to BK7, memory cells MC coupled to word lines WL and bit lines may be arranged in the form of an array. Each of the first to eighth banks BK0 to BK7 may be divided into a plurality of sub-regions SUB0 to SUBn. The sub-regions SUB0 to SUBn may be configured to have different word lines. The number of banks BK0 to BK7 or the number of memory cells MC may be determined depending on the capacity of the semiconductor memory device 200.

The clock buffer 221 may receive a clock CK from the memory controller 100. The clock buffer 221 may generate an internal clock CLK by buffering the clock CK. Depending on an embodiment, the memory controller 100 may transfer system clocks CK_t and CK_c to the semiconductor memory device 200 in a differential manner, and the semiconductor memory device 200 may include clock buffers that receive the differential clocks CK_t and CK_c, respectively.

The CA buffer 222 may receive a command/address signal C/A from the memory controller 100 based on the clock CK. The CA buffer 222 may sample the command/address signal C/A based on the clock CK and output the internal command ICMD and the internal address IADD. Consequently, the semiconductor memory device 200 may be synchronized with the clock CK.

The command decoder 223 may decode the internal command ICMD which is output from the CA buffer 222 to generate an active command ACT, a precharge command PCG, a normal refresh command REF, a target refresh command TREF, and an aging signal AG_EN. Although not illustrated, the command decoder 223 may additionally generate a read command RD, a write command WT, a mode register command MRS, and the like by decoding the internal command ICMD.

The address decoder 224 may generate a bank address BA<0:3> by decoding the internal address IADD. The bank address BA<0:3> may be used to designate the first to eighth banks BK0 to BK7. Depending on an embodiment, a certain bit of the bank address BA<0:3> may be used to select all of the first to eighth banks BK0 to BK7. Although not illustrated, the address decoder 224 may generate a row address and a column address by decoding the internal address IADD, and provide the addresses to the row control circuit 212 and a column control circuit (not shown).

The address latch 225 may latch the internal address IADD according to the active command ACT to output an active address ADD_ACT. That is, the address latch 225 may provide the internal address IADD inputted with the active command ACT as the active address ADD_ACT.

The refresh control circuit 230 may store a plurality of sample addresses ADD_SAM0 to ADD_SAM7 per bank by sampling the active address ADD_ACT according to the active command ACT and the bank address BA<0:3> at random points of time. The refresh control circuit 230 may generate first to eighth bank refresh signals SR_BK<0:7> according to the target refresh command TREF and the bank address BA<0:3>, while controlling an activation of the first to eighth bank refresh signals SR_BK<0:7> such that a refresh period (or refresh rate) per bank is adjusted by the aging signal AG_EN. The refresh control circuit 230 may provide a target address TADD by selecting any from the sample addresses ADD_SAM0 to ADD_SAMn, according to the first to eighth bank refresh signals SR_BK<0:7>. As a result, the refresh control circuit 230 may control an output interval (i.e., timing) of the target address TADD such that the refresh period (or refresh rate) per bank is adjusted, according to the aging signal AG_EN.

In detail, the refresh control circuit 230 may include an aging decoder 232, a refresh decoder 233, a period adjusting circuit 234, the output control circuit 235, an active decoder 236, a sampling signal generation circuit 237, the input control circuit 238, and the address storing circuit 239.

The aging decoder 232 may generate first to eighth aging bank signals AG_BK<0:7> respectively corresponding to the first to eighth banks BK0 to BK7, by decoding the bank address BA<0:3> according to the aging signal AG_EN. For example, the aging decoder 232 may generate the second aging bank signal AG_BK<1> corresponding to the second bank BK1 according to the aging signal AG_EN, when the bank address BA<0:3> for designating the second bank BK1 is inputted.

The refresh decoder 233 may generate first to eighth target refresh bank signals TREF_BK<0:7> respectively corresponding to the first to eighth banks BK0 to BK7, by decoding the bank address BA<0:3> according to the target refresh command TREF. For example, the refresh decoder 233 may generate the second target refresh bank signal TREF_BK1 corresponding to the second bank BK1 when the bank address BA<0:3> for designating the second bank BK1 is inputted.

The period adjusting circuit 234 may generate first to eighth period control signals SR_EN_BK<0:7> for adjusting the refresh period (refresh rate) of the first to eighth banks BK0 to BK7, according to the first to eighth aging bank signals AG_BK<0:7>, respectively. The period adjusting circuit 234 may increase an activation section of a period control signal corresponding to an enabled aging bank signal, while decreasing or maintaining an activation section of a period control signal corresponding to a disabled aging bank signal. For example, the period adjusting circuit 234 may increase an activation section of the second period control signal SR_EN_BK<1> when the second aging bank signal AG_BK<1> corresponding to the second bank BK1 is enabled.

The output control circuit 235 may generate the first to eighth bank refresh signals SR_BK<0:7>, according to the first to eighth target refresh bank signals TREF_BK<0:7> and the first to eighth period control signals SR_EN_BK<0:7>. The output control circuit 235 may enable a corresponding bank refresh signal when both of a corresponding target refresh bank signal and a corresponding period control signal are enabled. Referring to FIG. 7, the output control circuit 235 may be implemented with first to eighth AND gates 235_AD1 to 235_AD8 for performing a logic AND operation on the first to eighth target refresh bank signals TREF_BK<0:7> and the first to eighth period control signals SR_EN_BK<0:7>, respectively.

The active decoder 236 may generate first to eighth active bank signals ACT_BK<0:7> respectively corresponding to the first to eighth banks BK0 to BK7, by decoding the bank address BA<0:3> according to the active command ACT. For example, the active decoder 236 may generate the second active bank signal ACT_BK<1> corresponding to the second bank BK1 according to the active command ACT, when the bank address BA<0:3> for designating the second bank BK1 is inputted.

The sampling signal generation circuit 237 may generate first to eighth sampling signals SAEN_BK<0:7> that are randomly enabled. Depending on an embodiment, the sampling signal generation circuit 237 may generate first to eighth sampling signals SAEN_BK<0:7> that are sequentially enabled based on the internal clock CLK. The sampling signal generation circuit 237 may be implemented with a pseudo-random binary sequence (PRBS) based random pattern generator, or a linear feedback shift register (LFSR) based random pattern generator.

The input control circuit 238 may generate first to eighth input control signals SAM_BK<0:7>, according to the first to eighth active bank signals ACT_BK<0:7> and the first to eighth sampling signals SAEN_BK<0:7>. The input control circuit 238 may enable a corresponding input control signal when both of a corresponding active bank signal and a corresponding sampling signal are enabled. Referring to FIG. 8, the input control circuit 238 may be implemented with first to eighth AND gates 238_AD1 to 238_AD8 for performing a logic AND operation on the first to eighth active bank signals ACT_BK<0:7> and the first to eighth sampling signals SAEN_BK<0:7>, respectively.

The address storing circuit 239 may store the active address ADD_ACT as the sample addresses ADD_SAM0 to ADD_SAM7 per bank, according to the first to eighth input control signals SAM_BK<0:7>. The address storing circuit 239 may output, as the target address TADD, any of the sample addresses ADD_SAM0 to ADD_SAM7 according to the first to eighth bank refresh signals SR_BK<0:7>. The address storing circuit 239 may include first to eighth latch circuits LAT_B0 to LAT_B7 respectively corresponding to the first to eighth banks BK0 to BK7. Referring to FIG. 9, each of the latch circuits LAT_B0 to LAT_B7 may store the active address ADD_ACT as its sample address when a corresponding control signal of the first to eighth input control signals SAM_BK<0:7> is enabled. Each of the latch circuits LAT_B0 to LAT_B7 may output the stored sample address as the target address TADD when a corresponding bank refresh signal of the first to eighth bank refresh signals SR_BK<0:7> is enabled.

The row control circuit 212 may activate a word line WL corresponding to the internal address IADD according to the active command ACT (i.e., the first to eighth active bank signals ACT_BK<0:7>), and precharge the activated word line WL according to the precharge command PCG. In order to select a word line to be refreshed during the normal refresh operation, a refresh counter (not shown) for generating a counting address that is sequentially increasing according to the normal refresh command REF may be additionally provided. The row control circuit 212 may perform the normal refresh operation of sequentially refreshing the plurality of word lines WL corresponding to the counting address according to the normal refresh command REF. The row control circuit 212 may perform the target refresh operation of refreshing one or more neighboring word lines of a word line WL corresponding to the target address TADD according to the target refresh command TREF (i.e., first to eighth bank refresh signals SR_BK<0:7>).

Figure 10:
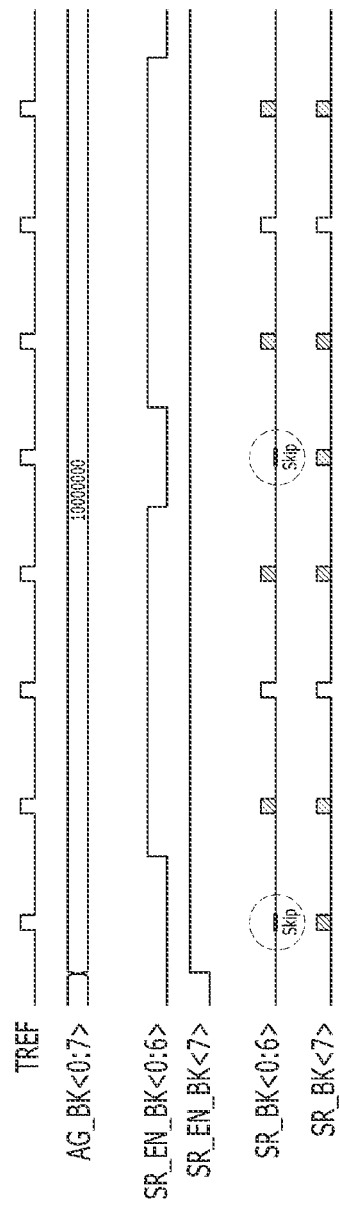
FIG. 10 is a timing diagram for describing a method for adjusting a refresh period of each bank, in accordance with an embodiment of the present invention.

FIG. 10 is a timing diagram for describing a method for adjusting a refresh period of each bank, in accordance with an embodiment of the present invention. FIG. 10 shows a case where the bank address BA<0:3> for designating all banks BK0 to BK7 is inputted, and all of the target refresh bank signals TREF_BK<0:7> are simultaneously enabled according to the target refresh command TREF.

Referring to FIG. 10, the eighth aging bank signal AG_BK<7> corresponding to the eighth bank BK7 is enabled.

The aging decoder 232 may select the eighth bank BK7 from the first to eighth banks BK0 to BK7 by decoding the bank address BA<0:3> and enable the eighth aging bank signal AG_BK<7> corresponding to the eighth bank BK7 according as the aging signal AG_EN is enabled. The period adjusting circuit 234 may increase an activation section of the eighth period control signal SR_EN_BK<7> corresponding to the enabled eighth aging bank signal AG_BK<7>, while maintaining the activation sections of the first to seventh period control signals SR_EN_BK<0:6>. The output control circuit 235 may enable the first to eighth bank refresh signals SR_BK<0:7>, according to the first to eighth period control signals SR_EN_BK<0:7> whenever the target refresh command TREF is inputted. At this time, the output control circuit 235 may enable the eighth bank refresh signal SR_BK<7> more frequently according to the eighth period control signal SR_EN_BK<7>. As a result, the target refresh period of the eighth bank BK<7> with the aging signal AG_EN enabled may be shorter.

As described above, in the memory system 10 in accordance with the first embodiment, the refresh analysis module 130 may divide at least one bank BK of the semiconductor memory device 200, into the plurality of sub-regions SUB0 to SUBn, and generate the aging signal AG_EN for each bank based on counting values generated by counting the number of inputs of the active command ACT per sub-region within the bank. Thus, the memory controller 100 may generate the aging signal AG_EN by analyzing a case where the row hammer risk is high when the active aggressor is concentrated only on particular addresses, due to a special occurrence such as hacking. The semiconductor memory device 200 may adjust the target refresh period (or cycle) for each bank according to the aging signal AG_EN. Accordingly, the memory system 10 may achieve the row hammer mitigation with a minimum area.

Figure 11:
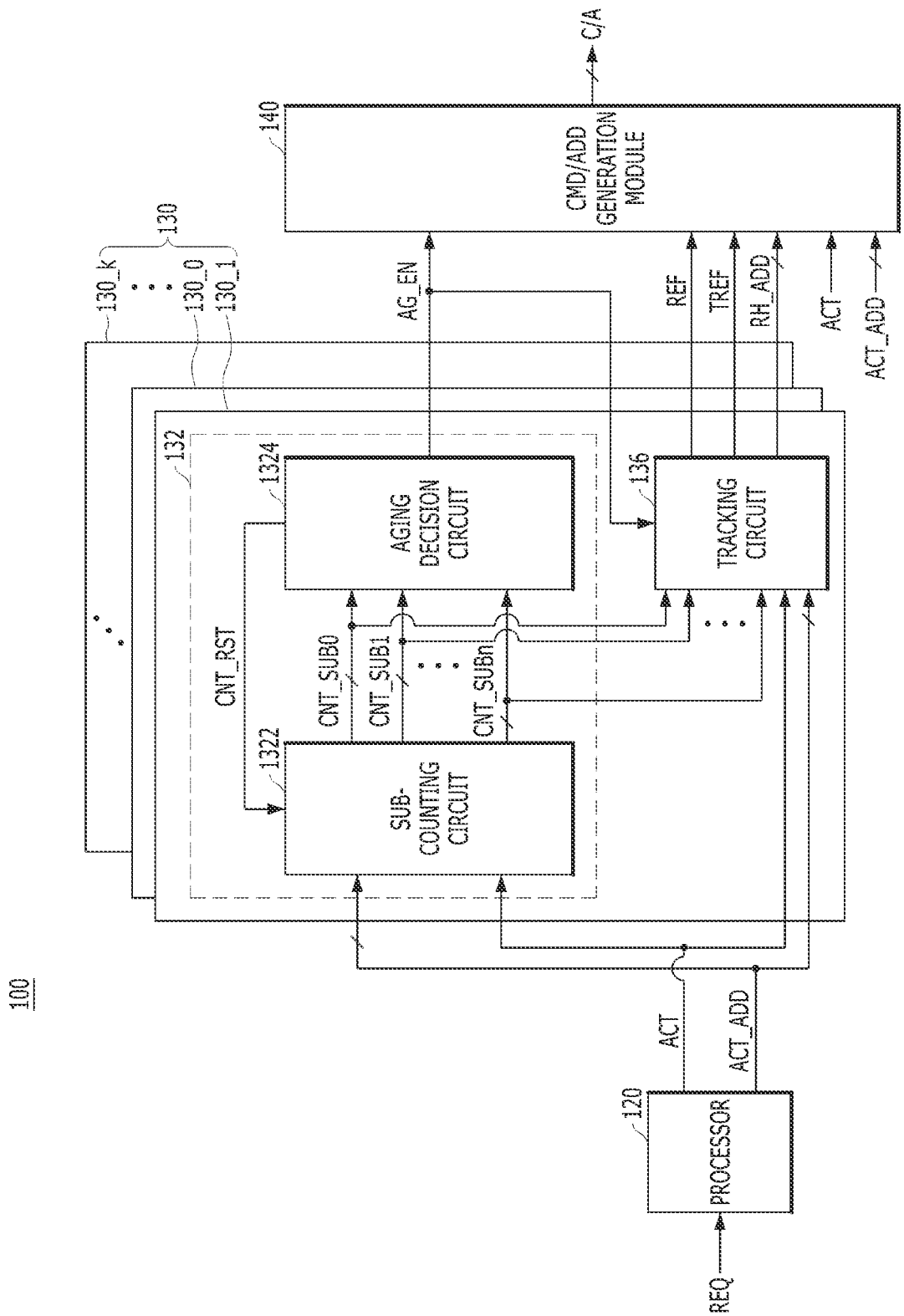
FIG. 11 is a detailed block diagram illustrating a memory controller shown in FIG. 1, in accordance with a second embodiment of the present invention.
Figure 12:
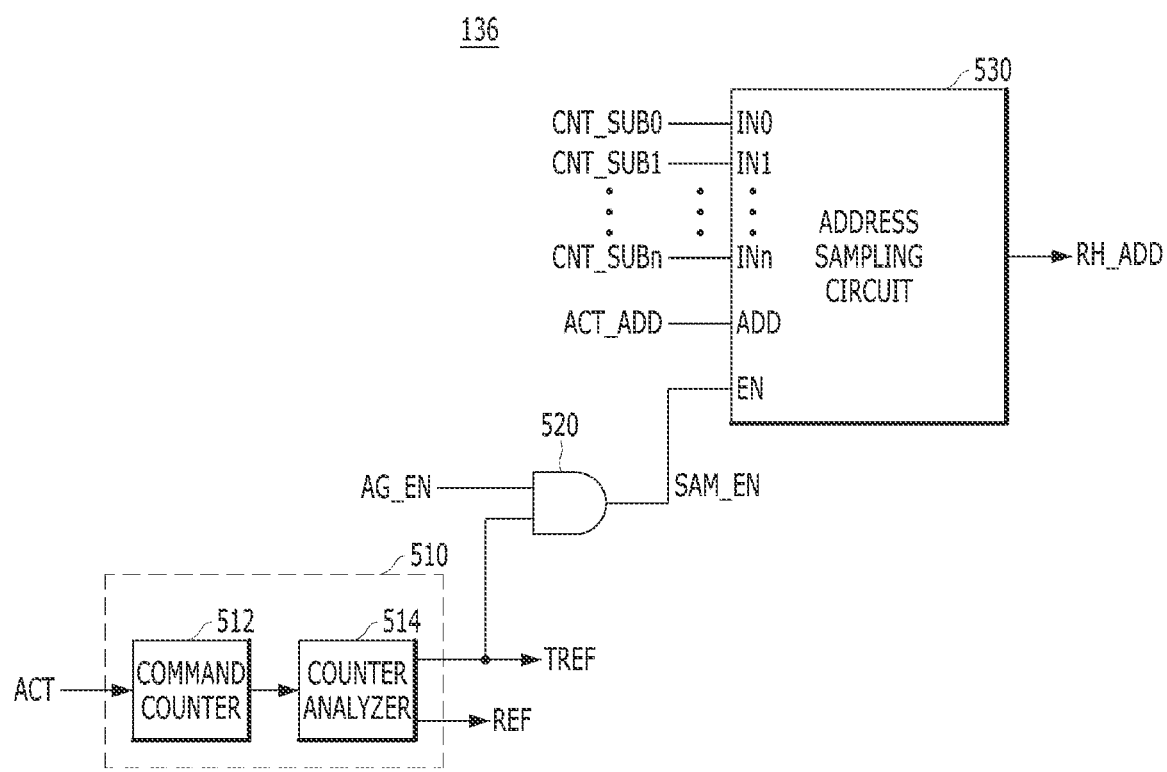
FIG. 12 is a detailed configuration diagram illustrating a tracking circuit of FIG. 11 in accordance with an embodiment of the present invention.
Figure 13:
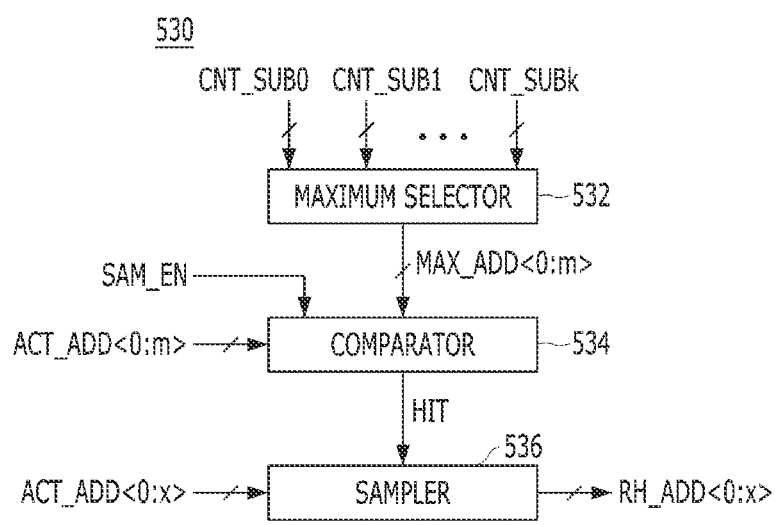
FIG. 13 is a detailed configuration diagram illustrating an address sampling circuit of FIG. 12 in accordance with an embodiment of the present invention.

Hereinafter, a detailed configuration of the memory system 10 in accordance with the second embodiment will be described FIG. 11 is a detailed block diagram illustrating the memory controller 100 shown in FIG. 1, in accordance with the second embodiment of the present invention. FIG. 12 is a detailed configuration diagram illustrating a tracking circuit 136 of FIG. 11 in accordance with an embodiment of the present invention. FIG. 13 is a detailed configuration diagram illustrating an address sampling circuit 530 of FIG. 12 in accordance with an embodiment of the present invention.

Referring to FIG. 11, the processor 120 may receive a request REQ from the host through the host interface 110. The processor 120 may generate an active command ACT and an active address ACT_ADD corresponding to the request REQ.

The refresh analysis module 130 may include a plurality of analysis circuits 130_0 to 130_k respectively corresponding to the banks BK0 to BKk of the semiconductor memory device 200. Each of the analysis circuits 130_0 to 130_k may include an aging analysis circuit 132 and the tracking circuit 136.

The aging analysis circuit 132 may include a sub-counting circuit 1322 and an aging decision circuit 1324. The aging analysis circuit 132 may have substantially the same configuration and operation of the aging analysis circuit 132 of FIG. 3.

The tracking circuit 136 may generate a normal refresh command REF and a target refresh command TREF, based on an active command ACT provided from the processor 120. The refresh command issue circuit 134 may issue the target refresh command TREF or the normal refresh command REF when the number of inputs of the active command ACT reaches a certain number. Further, the tracking circuit 136 may generate a row hammer address RH_ADD corresponding to the active address ACT_ADD according to an aging signal AG_EN and a plurality of counting values CNT_SUB0 to CNT_SUBn when the number of inputs of the active command ACT for each bank BK is greater than a set number.

Referring to FIG. 12, the tracking circuit 136 may include a refresh command issue circuit 510, an enable signal generation circuit 520, and the address sampling circuit 530.

The refresh command issue circuit 510 may generate the normal refresh command REF and the target refresh command TREF, based on the active command ACT. For example, the refresh command issue circuit 510 may include a command counter 512 and a counter analyzer 514. The refresh command issue circuit 510 may have substantially the same configuration and operation of the refresh command issue circuit 134 of FIG. 3.

The enable signal generation circuit 520 may generate a sampling enable signal SAM_EN according to the aging signal AG_EN when the target refresh command TREF is generated. The enable signal generation circuit 520 may enable the sampling enable signal SAM_EN when the aging signal AG_EN and the target refresh command TREF are enabled. For example, the enable signal generation circuit 520 may be implemented with an AND gate for performing a logic AND operation on the aging signal AG_EN and the target refresh command TREF.

The address sampling circuit 530 may generate the row hammer address RH_ADD corresponding to the active address ACT_ADD based on the counting values CNT_SUB0 to CNT_SUBn when the sampling enable signal SAM_EN is enabled.

Referring to FIG. 13, the address sampling circuit 530 may include a maximum selector 532, a comparator 534, and a sampler 536.

The maximum selector 532 may select a maximum counting value from the counting values CNT_SUB0 to CNT_SUBn, and output some of bits in the active address ACT_ADD, which specify a sub-region corresponding to the maximum counting value, as a maximum address MAX_ADD<0:m>. In an embodiment, the active address ACT_ADD is composed of (x+1) bits, the maximum selector 532 may store lower (m+1) bits (e.g., ACT_ADD<0:m>) for designating the sub-regions SUB0 to SUBn of the corresponding bank, among the active address ACT_ADD<0:x>, as a table form. The maximum selector 532 may output the (m+1) bits ACT_ADD<0:m> corresponding to the maximum counting value, as the maximum address MAX_ADD<0:m>.

The comparator 534 may be activated according to the sampling enable signal SAM_EN. The comparator 534 may output a comparison signal HIT by comparing the maximum address MAX_ADD<0:m> with (m+1) bits ACT_ADD<0:m> of the active address ACT_ADD. The comparator 534 may enable the comparison signal HIT when respective bits of the maximum address MAX_ADD<0:m> are identical to the (m+1) bits ACT_ADD<0:m>.

The sampler 536 may sample the active address ACT_ADD as the row hammer address RH_ADD when the comparison signal HIT is enabled.

With the above configuration, in a case where the aging signal AG_EN is enabled and the number of inputs of the active command ACT for each bank is greater than the set number, the tracking circuit 136 may output the currently inputted active address ACT_ADD as the row hammer address RH_ADD, when (m+1) number of bits ACT_ADD<0:m> of the currently inputted active address ACT_ADD are identical to (m+1) number of bits ACT_ADD<0:m> for specifying a sub-region corresponding to the maximum counting value among the counting values CNT_SUB0 to CNT_SUBn.

Referring back to FIG. 11, the command/address generation module 140 may generate a command/address signal C/A by scheduling the active command ACT and the active address ACT_ADD provided from the processor 120, and the normal refresh commands REF, the target refresh command TREF, the aging signal AG_EN, and the row hammer address RH_ADD provided from the refresh analysis module 130. The command/address generation module 140 may output the active address ACT_ADD together with the active command ACT, as the command/address signal C/A, and provide the normal refresh command REF or the aging signal AG_EN together with the bank address including the bank information as the command/address signal C/A. The command/address generation module 140 may provide the target refresh command TREF together with the row hammer address RH_ADD, as the command/address signal C/A.

Figure 14:
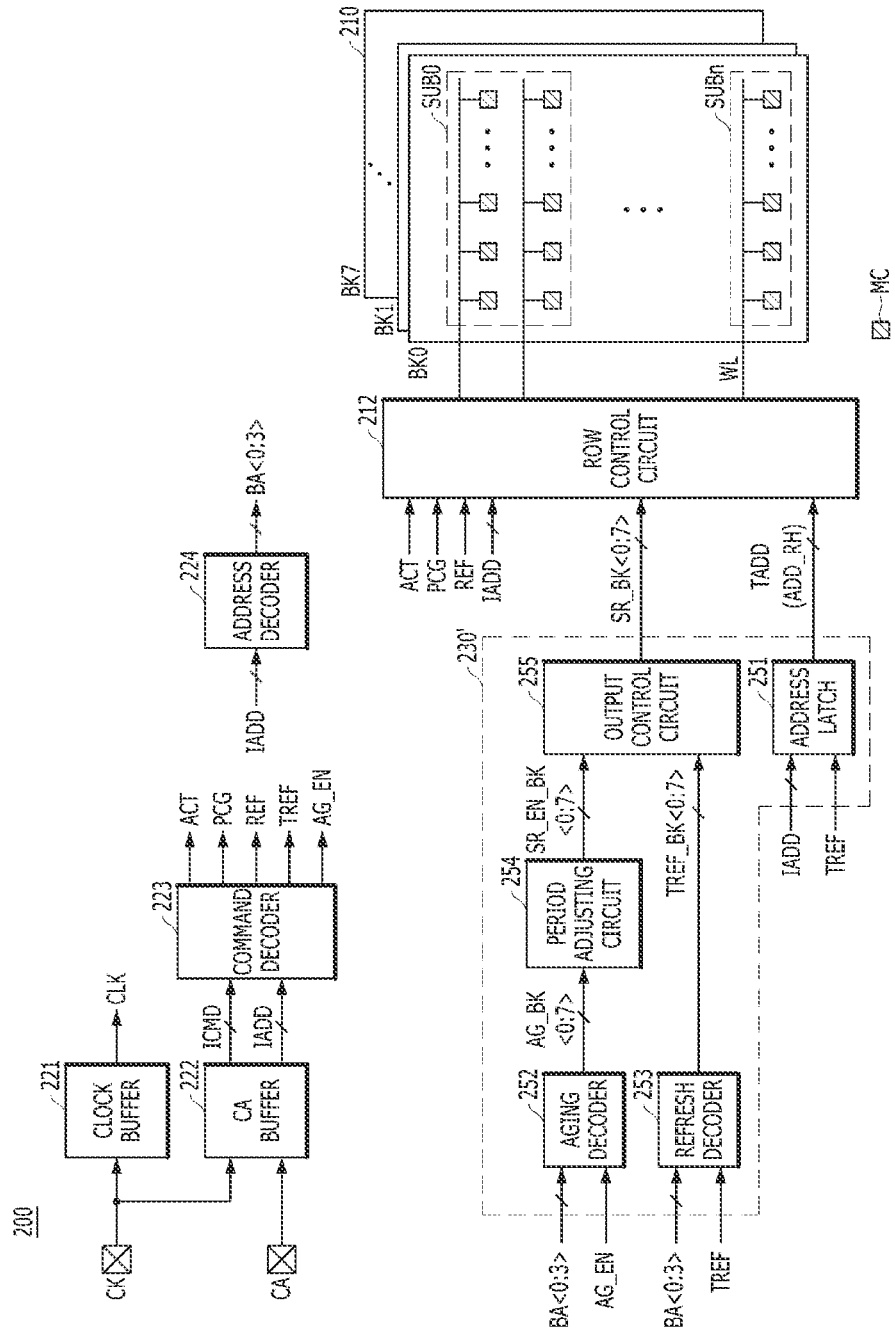
FIG. 14 is a detailed block diagram illustrating a memory device corresponding to the memory controller shown in FIG. 11, in accordance with an embodiment of the present invention.

FIG. 14 is a detailed block diagram illustrating the semiconductor memory device 200 corresponding to the memory controller shown in FIG. 11, in accordance with an embodiment of the present invention.

Referring to FIG. 14, the semiconductor memory device 200 may include the memory cell array 210, a row control circuit 212, a clock buffer 221, a command/address (CA) buffer 222, a command decoder 223, an address decoder 224, and the refresh control circuit 230'.

The memory cell array 210, the row control circuit 212, the clock buffer 221, the CA buffer 222, the command decoder 223, and the address decoder 224 of FIG. 14 may have configurations substantially the same as those of FIG. 6.

The refresh control circuit 230' may provide a target address TADD by latching an internal address IADD according to a target refresh command TREF. The refresh control circuit 230' may generate first to eighth bank refresh signals SR_BK<0:7> according to the target refresh command TREF and a bank address BA<0:3>, while controlling an activation of the first to eighth bank refresh signals SR_BK<0:7> such that a refresh period (or refresh rate) per bank is adjusted by an aging signal AG_EN.

In detail, the refresh control circuit 230' may include an address latch 251, an aging decoder 252, a refresh decoder 253, a period adjusting circuit 254, and an output control circuit 255.

The address latch 251 may provide the target address TADD by latching the internal address IADD according to the target refresh command TREF. At this time, since the internal address IADD inputted together with the target refresh command TREF may correspond to a row hammer address ADD_RH, the row hammer address ADD_RH (i.e., RH_ADD of FIG. 11) provided from the memory controller 100 may be provided as the target address TADD.

The aging decoder 252 may generate first to eighth aging bank signals AG_BK<0:7> respectively corresponding to the first to eighth banks BK0 to BK7, by decoding the bank address BA<0:3> according to the aging signal AG_EN.

The refresh decoder 253 may generate first to eighth refresh bank signals TREF_BK<0:7> respectively corresponding to the first to eighth banks BK0 to BK7, by decoding the bank address BA<0:3> according to the target refresh command TREF.

The period adjusting circuit 254 may generate first to eighth period control signals SR_EN_BK<0:7> for adjusting the refresh period (refresh rate) of the first to eighth banks BK0 to BK7, according to the first to eighth aging bank signals AG_BK<0:7>, respectively. The period adjusting circuit 254 may have a configuration and operation substantially the same as the period adjusting circuit 234 of FIG. 6.

The output control circuit 255 may generate the first to eighth bank refresh signals SR_BK<0:7>, according to the first to eighth target refresh bank signals TREF_BK<0:7> and the first to eighth period control signals SR_EN_BK<0:7>. The output control circuit 255 may have a configuration and operation substantially the same as the output control circuit 235 of FIG. 6.

The row control circuit 212 may activate a word line WL corresponding to the internal address IADD according to an active command ACT, and precharge the activated word line WL according to a precharge command PCG. The row control circuit 212 may perform a normal refresh operation of sequentially refreshing the plurality of word lines WL corresponding to a counting address according to a normal refresh command REF. The row control circuit 212 may perform a target refresh operation of refreshing one or more neighboring word lines of a word line WL corresponding to the target address TADD according to the target refresh command TREF (i.e., first to eighth bank refresh signals SR_BK<0:7>).

As described above, in the memory system 10 in accordance with the second embodiment, the memory controller 100 may generate the aging signal AG_EN and the row hammer address RH_ADD corresponding thereto, by analyzing a case where the row hammer risk is high when the active aggressor is concentrated only on particular addresses, due to a special occurrence such as hacking. The semiconductor memory device 200 may adjust the target refresh period (or cycle) for each bank according to the aging signal AG_EN. Accordingly, the memory system 10 may achieve the row hammer mitigation with a minimum area.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory system, comprising:
a memory device including at least one bank; and
a memory control circuit suitable for:
  dividing the bank into a plurality of sub-regions according to an active address,
  generating an aging signal for the bank based on a plurality of counting values generated by counting a number of inputs of an active command for each of the sub-regions, and
  providing the active command, the active address, the aging signal, and a target refresh command,
wherein the memory device is suitable for:
  generating a sampling address by sampling the active address according to the active command, and
  performing a target refresh operation on a word line corresponding to the sampling address according to the target refresh command while adjusting a refresh period of the bank according to the aging signal.

2. The memory system of claim 1, wherein the sub-regions are configured to have different word lines.

3. The memory system of claim 1, wherein the memory control circuit includes:
an aging analysis circuit suitable for:
  generating the counting values by counting the number of inputs of the active command for each of the sub-regions, based on the active address,
  calculating a standard deviation of the counting values, and
  generating the aging signal according to the standard deviation; and
a refresh command issue circuit suitable for issuing the target refresh command when the number of inputs of the active command reaches a certain number.

4. The memory system of claim 3, wherein the aging analysis circuit includes:
a sub-counting circuit suitable for generating the counting values by counting the number of inputs of the active command for each of the sub-regions based on the active address; and
an aging decision circuit suitable for generating the aging signal and a count reset signal by calculating an average of the counting values and calculating the standard deviation based on the average, wherein the count reset signal initializes the sub-counting circuit.

5. The memory system of claim 4, wherein the sub-counting circuit includes:
a sub-decoder suitable for generating a plurality of sub-region signals for respectively designating the sub-regions by decoding a part of bits in the active address;
an active combiner suitable for outputting the sub-region signals as a plurality of sub-region activation signals according to the active command; and
sub-counters respectively corresponding to the sub-regions and initialized by the count reset signal, and each suitable for generating a corresponding counting value of the counting values by increasing its counting value when a corresponding sub-region activation signal of the sub-region activation signals is enabled.

6. The memory system of claim 4, wherein the aging decision circuit includes:
an average calculator suitable for calculating the average of the counting values;
a deviation calculator suitable for calculating the standard deviation based on the average; and
an aging analyzer suitable for:
  disabling the aging signal and enabling the count reset signal when the standard deviation is greater than a reference value, and
  enabling the aging signal and disabling the count reset signal when the standard deviation is less than or equal to the reference value.

7. The memory system of claim 3, wherein the refresh command issue circuit includes:
a command counter suitable for generating a count value by counting the number of inputs of the active command; and
a counter analyzer suitable for issuing the target refresh command when the count value reaches the certain number.

8. The memory system of claim 1, wherein the memory device includes:
a plurality of banks including the at least one bank;
a refresh control circuit suitable for:
  storing the sample addresses for the banks by sampling the active address according to the active command and a bank address at random points of time, generating a plurality of bank refresh signals according to the target refresh command and the bank address, while controlling an activation of the bank refresh signals according to the aging signal, and providing a target address by selecting any sample address from the sample addresses according to the bank refresh signals; and a row control circuit suitable for refreshing one or more word lines corresponding to the target address according to the bank refresh signals.

9. The memory system of claim 8, wherein the refresh control circuit includes:

an aging decoder suitable for generating a plurality of aging bank signals by decoding the bank address according to the aging signal;

a refresh decoder suitable for generating a plurality of target refresh bank signals by decoding the bank address according to the target refresh command;

a period adjusting circuit suitable for generating a plurality of period control signals for adjusting the refresh period for each of the banks according to the aging bank signals;

an output control circuit suitable for generating the bank refresh signals according to the target refresh bank signals and the period control signals;

an input control circuit suitable for generating a plurality of input control signals according to the active command and the bank address at random points of time; and an address storing circuit suitable for storing the active address as the sample addresses for banks according to the input control signals, and outputting any of the sample addresses as the target address according to the bank refresh signals.

10. The memory system of claim 9, wherein the period adjusting circuit is suitable for increasing an activation section of a period control signal corresponding to an enabled aging bank signal of the aging bank signals, while decreasing or maintaining an activation section of a period control signal corresponding to a disabled aging bank signal of the aging bank signals.

11. A memory system, comprising:

a memory device including at least one bank; and a memory control circuit suitable for:

dividing the bank into a plurality of sub-regions according to an active address, generating an aging signal for the bank based on a plurality of counting values generated by counting a number of inputs of an active command for each of the sub-regions, generating a row hammer address according to the aging signal, and providing the aging signal, and a target refresh command with the row hammer address, wherein the memory device is suitable for performing a target refresh operation on a word line corresponding to the row hammer address according to the target refresh command while adjusting a refresh period of the bank according to the aging signal.

12. The memory system of claim 11, wherein the sub-regions are configured to have different word lines.

13. The memory system of claim 11, wherein the memory control circuit includes:

an aging analysis circuit suitable for:

generating the counting values by counting the number of inputs of the active command for each of the sub-regions, based on the active address, calculating a standard deviation of the counting values, and generating the aging signal according to the standard deviation; and a tracking circuit suitable for:

generating the target refresh command based on the active command, and generating the row hammer address corresponding to the active address according to the aging signal and the counting values when the number of inputs of the active command for the bank is greater than a preset number.

14. The memory system of claim 13, wherein the tracking circuit includes:

a refresh command issue circuit suitable for issuing the target refresh command when the number of inputs of the active command reaches the preset number;

an enable signal generation circuit suitable for generating a sampling enable signal according to the aging signal when the target refresh command is generated; and an address sampling circuit suitable for generating the row hammer address corresponding to the active address based on the counting values when the sampling enable signal is enabled.

15. The memory system of claim 14, wherein the address sampling circuit includes:

a maximum selector suitable for:

selecting a maximum counting value from the counting values, and outputting, as a maximum address, a part of bits in the active address, which specify a sub-region corresponding to the maximum counting value;

a comparator suitable for outputting a comparison signal by comparing the maximum address with the active address, according to the sampling enable signal; and a sampler suitable for sampling the active address as the row hammer address when the comparison signal is enabled.

16. The memory system of claim 11, wherein the memory device includes:

a plurality of banks including the at least one bank;

a refresh control circuit suitable for:

providing the target address by latching the row hammer address according to the target refresh command, and generating a plurality of bank refresh signals according to the target refresh command and the bank address, while controlling an activation of the bank refresh signals according to the aging signal; and a row control circuit suitable for refreshing one or more word lines corresponding to the target address according to the bank refresh signals.

17. The memory system of claim 16, wherein the refresh control circuit includes:

an address latch suitable for providing the target address by latching the row hammer address according to the target refresh command;

an aging decoder suitable for generating a plurality of aging bank signals by decoding the bank address according to the aging signal;

a refresh decoder suitable for generating a plurality of target refresh bank signals by decoding the bank address according to the target refresh command;

a period adjusting circuit suitable for generating a plurality of period control signals for adjusting the refresh period for each of the banks according to the aging bank signals; and an output control circuit suitable for generating the bank refresh signals according to the target refresh bank signals and the period control signals.

18. A memory controller, comprising:
a processor suitable for generating an active command and an active address corresponding to a request from a host;
a sub-counting circuit suitable for:
dividing at least one bank of a memory device into a plurality of sub-regions according to the active address, and
generating a plurality of counting values by counting a number of inputs of the active command for each of the sub-regions based on the active address;
an aging decision circuit suitable for generating an aging signal for the bank and a count reset signal by calculating an average of the counting values and calculating a standard deviation based on the average, wherein the count reset signal initializes the sub-counting circuit; and
a tracking circuit suitable for:
generating a target refresh command based on the active command, and
generating a row hammer address corresponding to the active address according to the aging signal and the counting values when the number of inputs of the active command for the bank is greater than a preset number.

19. The memory controller of claim 18, wherein the sub-regions are configured to have different word lines.

20. The memory controller of claim 18, wherein the sub-counting circuit includes:
a sub-decoder suitable for generating a plurality of sub-region signals for respectively designating the sub-regions by decoding a part of bits in the active address;
an active combiner suitable for outputting the sub-region signals as a plurality of sub-region activation signals according to the active command; and
sub-counters respectively corresponding to the sub-regions and each suitable for generating a corresponding counting value of the counting values by increasing its counting value when a corresponding sub-region activation signal of the sub-region activation signals is enabled.

21. The memory controller of claim 18, wherein the aging decision circuit includes:
an average calculator suitable for calculating the average of the counting values;
a deviation calculator suitable for calculating the standard deviation based on the average; and an aging analyzer suitable for:
disabling the aging signal and enabling the count reset signal when the standard deviation is greater than a reference value, and
enabling the aging signal and disabling the count reset signal when the standard deviation is less than or equal to the reference value.

22. The memory controller of claim 18, wherein the tracking circuit includes:
a refresh command issue circuit suitable for issuing the target refresh command when the number of inputs of the active command reaches the preset number;
an enable signal generation circuit suitable for generating a sampling enable signal according to the aging signal when the target refresh command is generated; and
an address sampling circuit suitable for generating the row hammer address corresponding to the active address based on the counting values when the sampling enable signal is enabled.

23. The memory controller of claim 22, wherein the address sampling circuit includes:
a maximum selector suitable for:
selecting a maximum counting value from the counting values, and
outputting, as a maximum address, a part of bits in the active address, which specify a sub-region corresponding to the maximum counting value;
a comparator suitable for outputting a comparison signal by comparing the maximum address with the active address, according to the sampling enable signal; and
a sampler suitable for sampling the active address as the row hammer address when the comparison signal is enabled.

24. A memory system comprising:
a memory device including a group of plural memory regions, and configured to perform a target refresh operation on the group at a shortened period in response to a shortening signal; and
a memory controller configured to generate the shortening signal when activation counts of the memory regions are statistically concentrated by a set amount or greater, wherein the activation count of each of the memory regions is a number of active commands provided for the memory region for a set amount of time, and wherein the memory controller is configured to calculate a standard deviation of the activation counts and generate the shortening signal according to the standard deviation.

* * * * *